United States Patent

[11] 3,593,192

[72] Inventors Shigemichi Nagano; Tsutomu Itano, both of Tokyo, Japan
[21] Appl. No 845,741
[22] Filed July 29, 1969
[45] Patented July 13, 1971
[73] Assignee Nippon Electric Company, Limited Tokyo, Japan
[32] Priority July 30, 1968
[33] Japan
[31] 43/54219

[54] DOUBLE CAVITY TYPE SOLID STATE OSCILLATOR DEVICE
3 Claims, 5 Drawing Figs.

[52] U.S. Cl. .......... 331/96, 331/107 R, 331/107 G
[51] Int. Cl. .......... H03b 7/14
[50] Field of Search .......... 331/96, 97, 107, 107 G, 107 T

[56] References Cited
UNITED STATES PATENTS

| | | | |
|---|---|---|---|
| 2,955,228 | 10/1960 | Ward | 315/5.21 |
| 3,401,355 | 9/1968 | Kafitz | 331/107 X |
| 3,510,800 | 5/1970 | Kaneko et al. | 331/96 |

*Primary Examiner*—Roy Lake
*Assistant Examiner*—Siegfried H. Grimm
*Attorney*—Sandoe, Hopgood and Calimafde

ABSTRACT: A double cavity type oscillator device is provided wherein a throttle window and iris are disposed between a main cavity having a built-in solid state oscillator element and an auxiliary cavity. The window electromagnetically couples the tunable auxiliary cavity with the main cavity. The iris, which is a low impedance capacitive iris, has a lateral width approximately equal to that of the end portion of the throttle window and to that of the auxiliary cavity, and a vertical dimension smaller than that of said throttle window.

INVENTORS
SHIGEMICHI NAGANO
TSUTOMU ITANO

BY Sandoe, Hopgood and Calimafde
ATTORNEY

INVENTORS
SHIGEMICHI NAGANO
TSUTOMU ITANO

BY Sandoe, Hopgood and Calimafde
ATTORNEYS

DOUBLE CAVITY TYPE SOLID STATE OSCILLATOR DEVICE

This invention relates to a solid state oscillator device using a bulk oscillator element of the Gunn diode, IMPATT diode or the type and, more particularly, to a double cavity type solid state oscillator device having an external tunable cavity.

BACKGROUND OF THE INVENTION

In an oscillator employing a solid state oscillator element, it is impossible to change the gap formed at the center part of the cavity resonator, as is the case with a klystron. It is therefore necessary to provide a movable part on the external wall thereof to make the adjustment of the oscillation frequency possible. The solid state oscillator device according to this invention is of the double cavity type consisting of a main cavity with a solid state oscillator element mounted in it and a tunable auxiliary cavity, wherein a capacitive iris of considerably low impedance is disposed between the two cavities for electromagnetically coupling the two cavities with one another. The present oscillator device is quite similar in its external appearance to a reflex klystron now widely in use. The structure of a klystron similar to the embodiments of the invention is shown, for example, in U.S. Pat. No. 2,955,228.

The difference between the oscillator device is this invention and the klystron, if roughly observed, may seem to lie only in the kind of electromagnetic energy source employed; solid state element as opposed to electron beam. However, careful comparison between the two will show that there is a distinctive difference. In a klystron, the impedance attributable to the gap in the main cavity is very high. Whereas, in a solid state oscillator device, the circuit impedance seen from the terminal of the solid state oscillator element is fairly low (usually, several tens of ohms). If the circuit arrangement as described in the aforementioned patent is applied directly to the solid state oscillator, it is impossible to achieve oscillation stably in a single mode. In addition, it is inevitable that an inadequate impedance is applied to the oscillator element and, as the result, it becomes impossible to effectively pick up electromagnetic energy from the oscillator element.

OBJECT OF THE INVENTION

The object of this invention is therefore to provide a tunable solid state oscillator device of the double cavity type, which eliminates the above-mentioned disadvantages of conventional devices and in which the oscillation is generated in a single mode and the circuit impedance seen by the solid state oscillator element is lowered so as to more nearly match the oscillator element, making it possible to derive electromagnetic energy effectively.

SUMMARY OF THE INVENTION

According to this invention, a double-cavity type oscillator device is provided wherein a throttle window and iris are disposed between a main cavity having a built-in solid state oscillator element and an auxiliary cavity. The window electromagnetically couples the tunable auxiliary cavity with the main cavity. The iris, which is a low impedance capacitive iris, has a lateral width approximately equal to that of the end portion of the throttle window and to that of the auxiliary cavity, and a vertical dimension smaller than that of said throttle window. This capacitive iris is for effecting oscillation only in the operating resonant mode for converting the circuit impedance, which is a load upon the solid state oscillator element, into an impedance through which electromagnetic energy can be effectively derived from the oscillator element. Thus, the oscillator device effectively produces oscillation stably in a single operating mode, i.e., full-wave mode.

Comparing the device of this invention with the device as described in the foregoing patent, it will be clearly understood that there is a distinctive difference between the two particularly in respect of the electromagnetic coupling part between the main cavity and the auxiliary cavity.

This invention will be explained in detail in conjunction with the accompanying drawing: in which FIG. 1 is a longitudinal cross-sectional view showing an embodiment of the invention, FIG. 2 is a cross-sectional view across the line 2–21 of the structure shown in FIG. 1, FIG. 3 is a cross-sectional view across the line 3–31 of the structure shown in FIG. 1, FIG. 4 is a partial plan view showing a part of the structure of FIG. 1 seen from the arrow line 4–41; and FIG. 5 is a partial cross-sectional view of another embodiment of the invention showing parts corresponding to the section across the line 3–31 of FIG. 1.

DETAILED DESCRIPTION OF THE INVENTION

Figure 1:
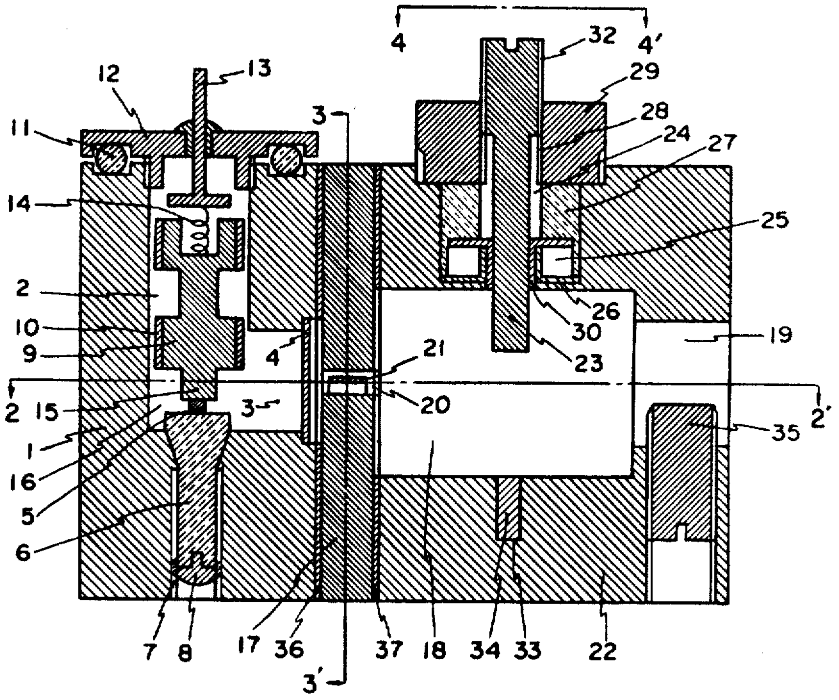
Figure 2:
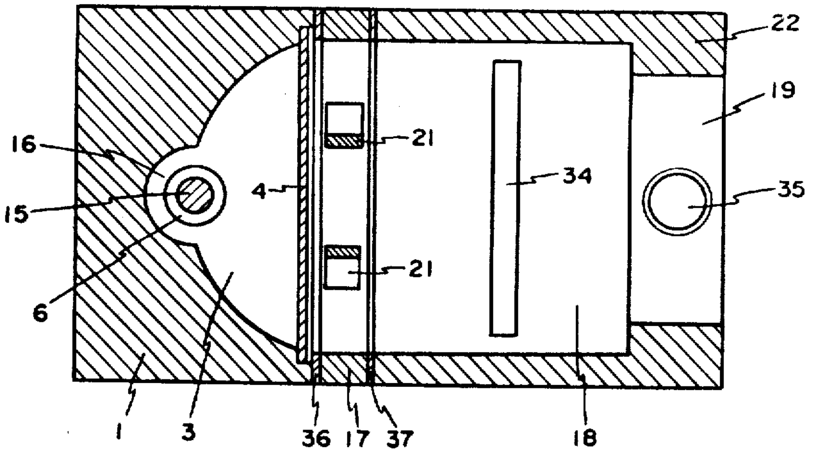
Figure 3:
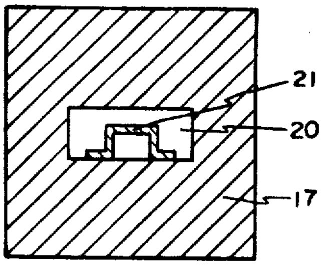

Referring to FIGS. 1 through 3, double cavity type solid state oscillation device of this invention has a main body 1 made from a copper block having a longitudinal hole 2. A curved void, i.e., a throttle hole 3, is provided in one side of the block 1. This hole communicates with the hole 2. As shown in FIG. 2, throttle hole 3 is in cross section a semicircular disc which is a little smaller than a half-circle. At the end portion of the throttle hole 3, an insulation plate 4 such as a thin mica plate is hermetically sealed to the block 1 by a brazing process or the like. A solid state oscillator element 5 is secured to the plane surface of a threaded copper stud 6 by a thermal compression method or the like. The stud 6 is screwed into a threaded hole which is formed in the block 1 concentrically with the longitudinal hole 2. The threaded hole 7 is then hermetically sealed by a bonding agent 8 such as epoxy resin. A conductive rod 9 for providing a connection to a bias voltage source (not shown) also serves as a high frequency choke in cooperation with the internal surface of the hole 2. An insulation film 10 having a low loss character, such as Teflon, is coated on the large circumferential surface of the rod 9. With this arrangement, the rod 9 is electrically insulated from the block 1 and, at the same time, can be smoothly slid in the longitudinal hole 2 only in the longitudinal direction. The rod 9 is electrically connected via a coil spring 14 to a conductor 13 of a hermetically sealed terminal 12 which hermetically seals the longitudinal hole 2 by a ring 11 of circular cross section. Mechanically, the flat surface of a protruding portion 15 of the rod 9 presses the oscillator element 5 against the stud 6. The cavity parallelepiped-shaped the longitudinal hole 2 and the throttle hole 3 is fitted with an inert gas, for example, argon, and this arrangement prevents deterioration of the interface of the oscillator element 5. Thus a main cavity 16 is formed, and electromagnetic energy can be obtained from the oscillator element 5 by applying a DC voltage across the conductor 13 and the block 1. The generated electromagnetic energy passes through the throttle hole 3 and insulation window 4, and further passes through the capacitive iris 17 and then enters a rectangular parallelepiped-shaped auxiliary cavity 18. Electromagnetic energy entering the auxiliary cavity 18 passes through the output window 19 and is taken out to an external circuit (not shown). The capacitive iris 17 is made of a conductor plate in which a rectangular aperture 20 is formed nearly at its vertical midpoint. The horizontal width of the aperture 20 is approximately the same as that of the open end of the throttle window 3. Within the aperture 20, a U-shaped metal piece piece 21 is fixed to the iris 17 approximately in the center part of the lateral width of the aperture 20 as shown in FIG. 3.

According to this invention, it is especially important that the vertical dimension of the aperture 20 of the iris 17 is smaller than that of the throttle hole 3. By providing an iris having this feature, about 90 percent of improvement is achieved in separating the oscillation of an undesirable mode from the oscillation of the desired mode. Furthermore, by providing the metallic piece 21, it is possible to suitably adjust the value of the circuit impedance imposed as a load on the solid state oscillator element 5. Also, it is feasible to compensate for the unevenness in the characteristic of the solid state oscillator element by mechanically changing the shape of the metal piece 21. The thickness of the iris plate 17, the vertical dimension of the aperture 20 and the size of the metal piece 21 are determined mainly by a trial asymptotic method.

A frequency adjusting rod 23 is disposed in the metal body 22 forming the auxiliary cavity 18. The length of the rod 23 inserted at the center of the auxiliary cavity 18 can be changed. A return line of a quarter wavelength is provided within the hole 24 to form a high frequency choke 25. The choke 25 consists of a choke members 26 and 27, which are fixed by the member 29 having a threaded hole 28 which allows for adjustment of rod 23 in the axial direction.

Figure 4:
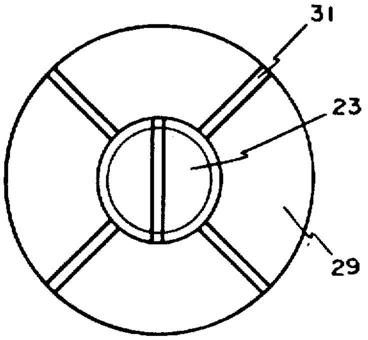

An insulative sleeve 30 of Teflon is inserted between the adjusting rod 23 and the member 26. This structure prevents an undesirable lateral movement of the rod 23 during the periods of adjustment. The member 29 has a slot in the longitudinal direction, with "slot gaps," as shown in FIG. 4. Thus, the member 29 securely holds the threaded portion 32 of the adjusting rod 23 to prevent its vibration.

A groove 33 extending in the lateral direction is disposed on the inside surface of the auxiliary cavity 18 facing the adjusting rod 23. The groove 33 is filled with a resistive material 34, which shows very low loss against the oscillation of the operating mode i.e., the full-wave mode, but shows a larger loss against the half-wave mode and the 3/2 wave mode. Thus, no oscillation of an unnecessary mode is generated. An output coupling window 19 is disposed on one wall of the metallic body 22 for extracting the generated energy through the auxiliary cavity 18. A coupling adjusting screw 35 is disposed approximately at the center of the window.

In order to improve the contact between the block 1 and the iris 17 and between the iris 17 and the metal body 22, metal foils 36 and 37 are inserted.

In operation, upon the application of a bias voltage to the oscillator element 5, the device initiates oscillation at a frequency determined by the shape and size of the main cavity 16 and iris 17 auxiliary cavity 18, namely at the resonance frequency of the full-wave mode. This frequency is changed by changing the length of the protruding portion of the adjusting rod 23. The oscillation output can be increased to nearly maximum value from the oscillator element 5 by slightly changing the shape of the metallic piece 21 or by changing the protruding length of the adjusting screw 35.

Figure 5:
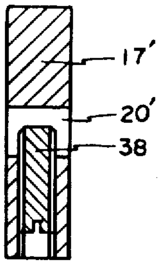

FIG. 5 is a partial sectional view of a modification of the foregoing embodiment, wherein a screw 38 is disposed approximately in the center part of the hole 20', instead of the metallic piece disposed in the iris 17'. In this arrangement, instead of changing the shape of the metallic piece, the screw 36 allows the change of the protrusion length, thereby providing a suitable load impedance to the solid state oscillator element and making it possible to separate the undesirable oscillation mode from the desired oscillation mode.

As has been described, there is provided a double cavity type solid state oscillator in which the iris 17 having the aperture 20 of smaller vertical dimension than that of the throttle hole 3 is disposed between the block 1 and the metallic body 22, whereby the device produces a stable oscillation in the desired oscillation mode and whereby the oscillation output is increased with the improved separation of desired and undesired oscillation modes. With this structure, the oscillation frequency can be changed up to 15 percent of the center frequency. The variable frequency range is much wider than that attainable with the conventional solid state oscillators.

The foregoing embodiments of the invention may be modified in many ways. For example, the hermetic seal may be omitted when the oscillator element 5 is incorporated into a pill-type case. Also, the main cavity 16 may be such that the high frequency is disposed in the portion of longitudinal hole 2 instead of forming the different diameters to the bias line rod 9. Also, the output may be taken out through a coaxial cable. Furthermore, the groove 33 and the resistor body 34 may be omitted.

What we claim is:

1. A double cavity type solid state oscillator device having a main and an auxiliary cavity; a throttle hole communicating with said main cavity and having an axis substantially perpendicular to the axis of said main cavity; a solid state oscillation element mounted within said main cavity; a resonant frequency adjusting member disposed within said auxiliary cavity; an iris disposed between said throttle hole and said auxiliary cavity for providing electromagnetic coupling between said main and auxiliary cavities, the aperture of said iris, measured in the direction of the axis of said main cavity, being not greater than that of said throttle hole; and at least one metal piece mounted on said iris at said aperture in a direction parallel to the plane of said iris.

2. A double cavity type solid state oscillator device comprising: a block of conductive material including a main cavity, a throttle hole communicating with said main cavity and having an axis substantially perpendicular to the axis of said main cavity; a solid state oscillation element having first and second electrodes disposed within said main cavity and having one of its said electrodes in direct contact with said block; means for supporting said oscillation element and for connecting the other of said electrodes to a power supply for oscillation; an auxiliary cavity in said block having an opening at its end facing said main cavity; an adjustment rod in said auxiliary cavity for changing the resonant frequency thereof; an iris interposed between said throttle hole and said auxiliary cavity providing electromagnetic coupling between said main and auxiliary cavities, the aperture of said iris having a dimension smaller than that of said opening of said throttle hole in the direction of the axis of said main cavity; and at least one metal piece protruding within said aperture.

3. The double cavity type solid state oscillator device claimed in claim 2, in which said throttle hole increases in cross section from said main cavity to said aperture of said iris in the direction perpendicular to the axis of said main cavity, and having a final dimension approximately equal to the dimension of the aperture in said iris in said direction.